(12) United States Patent
Hayashi

(10) Patent No.: US 8,137,872 B2
(45) Date of Patent: Mar. 20, 2012

(54) REFLECTIVE MASK BLANK FOR EUV LITHOGRAPHY

(75) Inventor: Kazuyuki Hayashi, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 12/952,254

(22) Filed: Nov. 23, 2010

(65) Prior Publication Data

US 2011/0070534 A1   Mar. 24, 2011

Related U.S. Application Data

(63) Continuation of application No. PCT/JP2009/061048, filed on Jun. 17, 2009.

(30) Foreign Application Priority Data

Jun. 19, 2008  (JP) .................................. 2008-160344

(51) Int. Cl.
*G03F 1/00* (2006.01)
*B32B 9/00* (2006.01)

(52) U.S. Cl. ........................................... 430/5; 428/430

(58) Field of Classification Search .............. 430/5, 394; 428/428, 430; 378/35
See application file for complete search history.

(56) References Cited

U.S. PATENT DOCUMENTS

| 7,713,666 B2 | 5/2010 | Hayashi et al. |
| 7,718,324 B2 | 5/2010 | Hayashi et al. |
| 7,855,036 B2 | 12/2010 | Hayashi et al. |
| 7,906,259 B2 * | 3/2011 | Hayashi et al. ................. 430/5 |
| 2003/0039922 A1 | 2/2003 | Han |
| 2005/0208389 A1 | 9/2005 | Ishibashi |
| 2006/0245057 A1 | 11/2006 | Van Herpen |
| 2006/0245058 A1 | 11/2006 | Van Herpen |
| 2008/0248409 A1 | 10/2008 | Ishibashi |
| 2008/0316595 A1 | 12/2008 | Van Herpen |

(Continued)

FOREIGN PATENT DOCUMENTS

JP   2004-6798   1/2004

(Continued)

OTHER PUBLICATIONS

International Search Report issued Aug. 18, 2009 in PCT/JP2009/061048 filed Jun. 17, 2009.

(Continued)

*Primary Examiner* — Stephen Rosasco
(74) *Attorney, Agent, or Firm* — Oblon, Spivak, McClelland, Maier & Neustadt, L.L.P.

(57) ABSTRACT

To provide a reflective mask blank for EUV lithography having a low reflective layer having a low reflectance in the wavelength region of EUV light and an inspection light for a mask pattern, particularly having low reflection properties in the entire wavelength region (190 to 260 nm) of an inspection light for a mask pattern, and having a high etching rate in chlorine type gas etching. A reflective mask blank for EUV lithography, comprising a substrate, and a reflective layer to reflect EUV light, an absorber layer to absorb EUV light and a low reflective layer to an inspection light (wavelength:190 nm to 260 nm) for a mask pattern, formed in this order over the substrate, wherein the low reflective layer contains silicon (Si) and nitrogen (N) in a total content of at least 95 at %, has a Si content of from 5 to 80 at %, and a N content of from 15 to 90 at %.

20 Claims, 1 Drawing Sheet

U.S. PATENT DOCUMENTS

| | | |
|---|---|---|
| 2008/0318140 A1 | 12/2008 | Hayashi |
| 2009/0011341 A1 | 1/2009 | Hayashi |
| 2010/0035165 A1 | 2/2010 | Hayashi et al. |
| 2010/0304283 A1 | 12/2010 | Hayashi et al. |

FOREIGN PATENT DOCUMENTS

| | | |
|---|---|---|
| JP | 2005-527964 | 9/2005 |
| JP | 2006-228767 | 8/2006 |
| JP | 2006-237192 | 9/2006 |
| JP | 2006-310793 | 11/2006 |
| JP | 2007-311758 | 11/2007 |
| JP | 2007-335908 | 12/2007 |
| JP | 2008-16821 | 1/2008 |

OTHER PUBLICATIONS

U.S. Appl. No. 13/093,968, filed Apr. 26, 2011, Hayashi.
U.S. Appl. No. 11/401,863, filed Apr. 12, 2006, Takaki, et al.
U.S. Appl. No. 13/004,081, filed Jan. 11, 2011, Hayashi, et al.
U.S. Appl. No. 13/070,728, filed Mar. 24, 2011, Hayashi.

* cited by examiner

REFLECTIVE MASK BLANK FOR EUV LITHOGRAPHY

CROSS-REFERENCE TO RELATED APPLICATIONS

This application is a continuation application of and claims the benefit of priority from International Application No. PCT/JP2009/061048, filed Jun. 17, 2009, which claims the benefit of priority from Japanese Patent Application No. 2008-160344, filed Jun. 19, 2008. The contents of PCT/JP2009/061048 and JP2008-160344 are incorporated by reference herein in their entirety.

TECHNICAL FIELD

The present invention relates to a reflective mask blank (in this specification, hereinafter referred to as "EUV mask blank") for EUV (Extreme Ultra Violet) lithography to be used for e.g. production of semiconductors.

BACKGROUND ART

In the semiconductor industry, a photolithography method using visible light or ultraviolet light has been employed as a technique for writing, on a Si substrate or the like, a fine pattern, which is required for forming an integrated circuit comprising such a fine pattern. However, the conventional photolithography method has been close to the resolution limit, while microsizing of semiconductor devices has been accelerated. In the case of the photolithography method, it is said that the resolution limit of a pattern is about ½ of an exposure wavelength, and that even if an immersion method is employed, the resolution limit is about ¼ of an exposure wavelength. Even if an immersion method using an ArF laser (193 nm) is employed, it is estimated that the resolution limit is about 45 nm. From this point of view, EUV lithography (EUVL), which is an exposure technique using EUV light having a shorter wavelength than ArF lasers, is considered to be promising as an exposure technique for 45 nm or below. In this specification, "EUV light" means a ray having a wavelength in a soft X-ray region or a vacuum ultraviolet ray region, specifically a ray having a wavelength of from about 10 to 20 nm, in particular, of about 13.5 nm±0.3 nm.

EUV light is apt to be absorbed by any substances and the refractive indices of substances are close to 1 at this wavelength, whereby it is impossible to use a dioptric system like a conventional photolithography employing visible light or ultraviolet light. For this reason, for EUV light lithography, a catoptric system, i.e. a combination of a reflective photomask and a mirror, is employed.

A mask blank is a stacked member for fabrication of a photomask, which has not been patterned yet. In the case of an EUV mask blank, it has a structure wherein a substrate made of glass or the like has a reflective layer to reflect EUV light and an absorber layer to absorb EUV light, formed thereon in this order. As the reflective layer, a multilayer reflective film is usually employed wherein a high refractive index layer and a low refractive index layer are alternately laminated to enhance the light reflectance when the layer surface is irradiated with EUV light. For the absorber layer, a material having a high absorption coefficient to EUV light, specifically e.g. a material containing Ta or Cr as the main component, is employed.

On the absorber layer of an EUV mask blank, a low reflective layer to a mask pattern inspection light is usually provided. A mask pattern after formed is inspected for pattern defects by using light in a wavelength region (190 to 260 nm) of a deep ultraviolet light. In the pattern inspection employing the light in the above wavelength region, pattern defects are detected by the difference in the reflectance between a portion where the low reflective layer and the absorber layer were removed by the patterning step and a region where the low reflective layer and the absorber layer remain, that is, the contrast of reflected light on the surface of these portions. In order to improve the sensitivity for inspection of a mask pattern, it is required to increase the contrast, and for that purpose, the low reflective layer is required to have low reflection properties in the above wavelength region, that is, it is required to have a reflectance in the above wavelength region of at most 15%.

Patent Document 1 discloses that formation of a low reflective layer comprising an oxide of a tantalum/boron alloy (TaBO) or an oxynitride of a tantalum/boron alloy (TaBNO) on an absorber layer comprising a nitride of a tantalum/boron alloy (TaBN) is preferred in view of a low reflectance in a wavelength region (190 nm to 260 nm) of the inspection light for a mask pattern.

Further, Patent Documents 2 and 3 disclose that formation of a low reflective layer comprising a metal, silicon (Si), oxygen (O) and nitrogen (N) on an absorber layer is preferred so as to adjust the reflectance in a wavelength region (190 nm to 260 nm) of the inspection light for a mask pattern.

Patent Document 1: JP-A-2004-6798
Patent Document 2: JP-A-2006-228767
Patent Document 3: JP-A-2007-335908

DISCLOSURE OF THE INVENTION

Problems to be Solved by the Invention

In any of Patent Documents 1 to 3, an oxide or an oxynitride is used for the low reflective layer. This is to improve the low reflection function at a wavelength in the vicinity of from 190 nm to 260 nm by addition of oxygen to the low reflective layer, however, if oxygen is added to the low reflective layer, the following problem of a decrease of the etching rate will arise.

In production of a mask for EUVL, when the absorber layer and the low reflective layer are patterned, usually a dry etching process is employed, and as an etching gas, a chlorine type gas (or a mixed gas containing a chlorine type gas) (hereinafter they will generically be referred to as a chlorine type gas) or a fluorine gas (or a mixed gas containing a fluorine type gas) (hereinafter they will generically be referred to as a fluorine type gas) is usually employed. In a case where a film containing Ru or a Ru compound is formed as a protective layer on the reflective layer for the purpose of preventing the reflective layer from being damaged in the etching process, mainly a chlorine type gas is used as the etching gas for the absorber layer, whereby the protective layer will less likely to be damaged. On the other hand, since the low reflective layer contains oxygen, the etching rate will be low with a chlorine type gas as compared with a fluorine type gas. Accordingly, in the etching process for the low reflective layer, usually a fluorine type gas is used.

In a case where the absorber layer and the low reflective layer are patterned, usually the above-described two-stage etching processes are required, that is, it is necessary to carry out an etching process employing a fluorine type gas for the low reflective layer and then carry out an etching process employing a chlorine type gas for the absorber layer. However, if such two stage etching processes are carried out, as two etching chambers are required, the processes will be complicated, and contamination in movement to the other chamber is considered. Further, in a case where the two etching processes are carried out in one chamber, as different gas species of a fluorine type gas and a chlorine type gas coexist, the chamber may be contaminated, or the processes will be unstabilized.

In order to solve the above problems of prior art, it is an object of the present invention to provide an EUV mask blank having excellent properties as an EUV mask blank, and having a low reflective layer particularly having a low reflectance in a wavelength region of a pattern inspection light and having a sufficient etching rate in an etching process employing a chlorine type gas.

Means to Solve the Problems

The present inventors have conducted extensive studies to solve the above problems and as a result, found that by the low reflective layer being a film (SiN film) containing Si and N, it has low reflective layer properties in the entire wavelength region (190 to 260 nm) of an inspection light for a mask pattern, and an improvement in the etching rate in an etching process employing a chlorine type gas is possible.

Further, the present inventors have further found that by the low reflective layer being a film (e.g. a SiGeN film, a SiBN film or a SiGeBN film) having Ge or B added to a SiN film, it further has low reflective layer properties, and a further improvement in the etching rate in an etching process employing a chlorine type gas is possible.

The present invention has been made based on the above discoveries, and provides the following.

(1) A reflective mask blank for EUV lithography, comprising a substrate, and a reflective layer to reflect EUV light, an absorber layer to absorb EUV light, and a low reflective layer to an inspection light (wavelength: 190 nm to 260 nm) for a mask pattern, formed in this order over the substrate, wherein the low reflective layer contains silicon (Si) and nitrogen (N) in a total content of at least 95 at %, a Si content of from 5 to 80 at %, and a N content of from 15 to 90 at %.

(2) A reflective mask blank for EUV lithography, comprising a substrate, and a reflective layer to reflect EUV light, an absorber layer to absorb EUV light, and a low reflective layer to an inspection light (wavelength: 190 nm to 260 nm) for a mask pattern, formed in this order over the substrate, wherein the low reflective layer contains silicon (Si) and nitrogen (N) and further contains at least one member selected from the group consisting of germanium (Ge) and boron (B), a total content of Si, N, Ge and B of at least 95 at %, a total content of Si, Ge and B of from 5 to 80 at %, a compositional ratio of Si to Ge and B of Si:(Ge+B)=4:1 to 9:1, and a N content of from 15 to 90 at %.

(3) The reflective mask blank for EUV lithography according to the above (1) or (2), wherein the low reflective layer has an oxygen (O) content of less than 5 at %.

(4) The reflective mask blank for EUV lithography according to any one of the above (1) to (3), wherein the surface roughness (rms) of the surface of the low reflective layer is at most 0.5 nm.

(5) The reflective mask blank for EUV lithography according to any one of the above (1) to (4), wherein the crystal structure of the surface of the low reflective layer is amorphous.

(6) The reflective mask blank for EUV lithography according to any one of the above (1) to (5), wherein the low reflective layer has a thickness of from 3 to 30 nm.

(7) The reflective mask blank for EUV lithography according to any one of the above (1) to (6), wherein the absorber layer contains tantalum (Ta) as the main component.

(8) The reflective mask blank for EUV lithography according to any one of the above (1) to (7), wherein the absorber layer contains tantalum (Ta) as the main component and contains at least one element selected from hafnium (Ha), silicon (Si), zirconium (Zr), germanium (Ge), boron (B), nitrogen (N) and hydrogen (H).

(9) The reflective mask blank for EUV lithography according to any one of the above (1) to (8), wherein the absorber layer has an oxygen (O) content of less than 25 at %.

(10) The reflective mask blank for EUV lithography according to any one of the above (1) to (9), wherein the total thickness of the absorber layer and the low reflective layer is from 40 to 200 nm.

(11) The reflective mask blank for EUV lithography according to any one of the above (1) to (10), wherein between the reflective layer and the absorber layer, a protective layer to protect the reflective layer at the time of patterning the absorber layer is formed, and the contrast represented by the following formula is at least 60%:

contrast (%)=(($R_2-R_1$)/($R_2+R_1$))×100 wherein $R_2$ is the reflectance of the surface of the protective layer to the wavelength (from 190 nm to 260 nm) of an inspection light for a mask pattern, and $R_1$ is the reflectance of the surface of the low reflective layer to the wavelength (from 190 nm to 260 nm) of an inspection light for a mask pattern.

(12) The reflective mask blank for EUV lithography according to the above (11), wherein the protective layer is formed by any one of Ru, a Ru compound, $SiO_2$ and CrN.

(13) The reflective mask blank for EUV lithography according to any one of the above (1) to (12), wherein the reflectance of the surface of the low reflective layer to the wavelength (from 190 nm to 260 nm) of an inspection light for a mask pattern is at most 15%.

(14) The reflective mask blank for EUV lithography according to any one of the above (1) to (13), wherein the low reflective layer is formed by a sputtering method using a Si target in an inert gas atmosphere containing nitrogen (N).

(15) The reflective mask blank for EUV lithography according to any one of the above (2) to (13), wherein the low reflective layer is formed by a sputtering method in an inert gas atmosphere containing nitrogen (N) using a target containing silicon (Si) and nitrogen (N) and further containing at least one member selected from the group consisting of germanium (Ge) and boron (B).

(16) A process for producing a reflective mask blank for EUV lithography, which comprises forming a reflective layer to reflect EUV light, an absorber layer to absorb EUV light, and a low reflective layer to an inspection light (wavelength: 190 nm to 260 nm) for a mask pattern, in this order over a substrate, wherein the low reflective layer is formed by a sputtering method in an inert gas atmosphere containing nitrogen (N) using a Si target.

(17) A process for producing a reflective mask blank for EUV lithography, which comprises forming a reflective layer to reflect EUV light, an absorber layer to absorb EUV light, and a low reflective layer to an inspection light (wavelength: 190 nm to 260 nm) for a mask pattern, in this order over a substrate, wherein the low reflective layer is formed by a sputtering method in an inert gas atmosphere containing nitrogen (N) using a target containing silicon (Si) and nitrogen (N) and further containing at least one member selected from the group consisting of germanium (Ge) and boron (B).

(18) A reflective mask for EUV lithography, having the absorber layer and the low reflective layer of the reflective mask blank for EUV lithography as defined in any one of the above (1) to (15) patterned.

(19) A process for producing a semiconductor integrated circuit, which comprises exposing an object to be exposed using the reflective mask for EUV lithography as defined in the above (18) to produce a semiconductor integrated circuit.

In this specification, a reflective mask blank for EUV lithography will sometimes be referred to as an EUV mask blank, and a reflective mask for EUV lithography as an EUV mask.

EFFECTS OF THE INVENTION

In the EUV mask blank of the present invention, the low reflective layer contains no oxygen, and accordingly even in an etching process employing a chlorine type gas, a sufficiently high etching rate as compared with a conventional low reflective layer will be obtained. Accordingly, etching of the low reflective layer and the absorber layer is possible only by a chlorine type gas, whereby simplification of the etching process and the etching apparatus is expected and in addition, a reduction of contamination in the etching process is also expected. Further, in the present invention, as the etching rate for the low reflective layer is high as compared with a conventional low reflective layer, the resist can be made thinner than ever before, and as a result, it is expected that the finer patterning becomes possible.

BEST MODE FOR CARRYING OUT THE INVENTION

Now, the EUV mask blank of the present invention will be described with reference to drawings.

Figure 1:
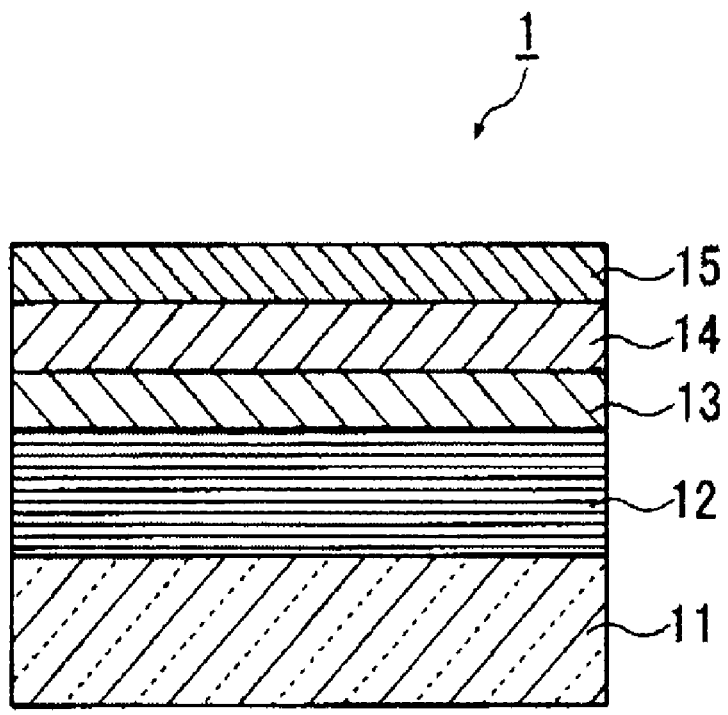
FIG. 1 is a cross sectional view schematically illustrating one embodiment of an EUV mask blank of the present invention.

FIG. 1 is a cross sectional view schematically illustrating one embodiment of an EUV mask blank of the present invention. A mask blank 1 shown in FIG. 1 comprises a substrate 11, and a reflective layer 12 to reflect EUV light and an absorber layer 14 to absorb EUV light formed in this order over the substrate. Between the reflective layer 12 and the absorber layer 14, a protective layer 13 to protect the reflective layer 12 when the absorber layer 14 is patterned is formed. On the absorber layer 14, a low reflective layer 15 to an inspection light of a mask pattern is formed. However, in the EUV mask blank 1 of the present invention, among the constituents shown in FIG. 1, only the substrate 11, the reflective layer 12, the absorber layer 14 and the low reflective layer 15 are essential, and the protective layer 13 is an optional constituent.

Now, the respective constituting elements of the mask blank 1 will be described.

The substrate 11 is required to satisfy the characteristics as a substrate for an EUV mask blank. Therefore, the substrate 11 is preferably one which has a low thermal expansion coefficient (specifically, a thermal expansion coefficient at 20° C. of preferably $0\pm0.05\times10^{-7}/°$ C., particularly preferably $0\pm0.03\times10^{-7}/°$ C.) and which is excellent in smoothness, flatness and resistance against a cleaning liquid to be used for e.g. cleaning of the mask blank or a photomask after patterning. Specifically, as such a substrate 11, glass having a low thermal expansion coefficient, such as a $SiO_2$—$TiO_2$ glass, may, for example, be used, but the substrate is not limited thereto, and a substrate of e.g. crystallized glass having β-quartz solid solution precipitated, quartz glass, silicon or metal, may also be used.

The substrate 11 preferably has a smooth surface having a surface roughness (rms) of at most 0.15 nm and a flatness of at most 100 nm, whereby a high reflectance and transfer precision can be obtained with the photomask after patterning. Here, the surface roughness (rms) is as determined in accordance with JIS B0601.

The size, thickness, etc. of the substrate 11 are suitably determined depending upon the design values of the mask or the like. In the after-mentioned Examples, a $SiO_2$—$TiO_2$ glass having a size of 6 inch (152 mm) square and a thickness of 0.25 inch (6.3 mm) was used.

It is preferred that no defects are present on the surface on a side where the reflective layer 12 is formed of the substrate 11. Even if they are present, in order that no phase defects will form by concave defects and/or convex defects, the depth of the concave defects and the height of the convex defects are preferably at most 2 nm, and the full width at half maximum of such concave defects and convex defects are preferably at most 60 nm.

The reflective layer 12 is not particularly restricted so long as it is one having desired characteristics as a reflective layer for an EUV mask blank. Here, the characteristic particularly required for the reflective layer 12 is a high EUV light reflectance. Specifically, when the surface of the reflective layer 12 is irradiated with light in a wavelength region of EUV light at an incidence angle of 6°, the maximum value of the light reflectance in the vicinity of a wavelength of 13.5 nm is preferably at least 60%, more preferably at least 65%. Even in a case where a protective layer 13 or a low reflective layer 15 is formed on the reflective layer 12, the maximum value of the light reflectance in the vicinity of a wavelength of 13.5 nm is preferably at least 60%, more preferably at least 65%.

As the reflective layer 12, a reflective multilayer film having high refractive index layers and low refractive index layers alternately stacked in a plurality of times, is usually used as the reflective layer 12, whereby a high EUV light reflectance can be attained. In the reflective multilayer film constituting the reflective layer 12, Mo is widely used for the high refractive index layers, and Si is widely used for the low refractive index layers. That is, a reflective Mo/Si multilayer film is most common. However, the reflective multilayer film is not limited thereto, and a reflective Ru/Si multilayer film, a reflective Mo/Be multilayer film, a reflective Mo compound/Si compound multilayer film, a reflective Si/Mo/Ru multilayer film, a reflective Si/Mo/Ru/Mo multilayer film or a reflective Si/Ru/Mo/Ru multilayer film may also be used.

The thicknesses and the number of repeating layer units of the respective layers constituting the reflective multilayer film constituting the reflective layer 12 may suitably be selected depending upon the film materials to be used and the EUV light reflectance required for the reflective layer. When a Mo/Si reflective film is taken as an example, in order to form a reflective layer 12 having the maximum value of the EUV light reflectance being at least 60%, the reflective multilayer film may be formed by stacking Mo layers having a thickness of 2.3±0.1 nm and Si layers having a thickness of 4.5±0.1 nm so that the number of repeating units will be from 30 to 60.

Here, the respective layers constituting the reflective multilayer film as the reflective layer 12 may be formed to have the desired thickness by means of a well-known film deposition method such as magnetron sputtering or ion beam sputtering. For example, in a case where a reflective Si/Mo multilayer film is formed by means of ion beam sputtering, it is preferred that a Si film is deposited to have a thickness of 4.5 nm at an ion-accelerated voltage of from 300 to 1,500 V at a film deposition rate of from 0.03 to 0.3 nm/sec by using a Si target as the target and using an Ar gas (gas pressure: $1.3\times10^{-2}$ Pa to $2.7\times10^{-2}$ Pa) as the sputtering gas, and then a Mo film is deposited to have a thickness of 2.3 nm at an ion-accelerated voltage of from 300 to 1,500 V at a film deposition rate of from 0.03 to 0.3 nm/sec by using a Mo target as the target and using an Ar gas (gas pressure: $1.3\times10^{-2}$ Pa to $2.7\times10^{-2}$ Pa) as the sputtering gas. This operation is regarded as one cycle, and by stacking Si films and Mo films preferably for 40 to 50 cycles, a reflective Si/Mo multilayer film will be formed.

In order to prevent oxidation of the surface of the reflective layer 12, the uppermost layer of the reflective multilayer film constituting the reflective layer 12 is preferably a layer made of a hardly oxidizable material. The layer made of a hardly oxidizable material will function as a cap layer of the reflective layer 12. As a specific example of the layer made of a hardly oxidizable material functioning as the cap layer, a Si layer may, for example, be mentioned. In a case where the reflective multilayer film constituting the reflective layer 12 is a Si/Mo film, the uppermost layer may be made to be a Si layer, so that the uppermost layer will function as a cap layer. In such a case, the thickness of the cap layer is preferably from 9 to 13 nm.

The protective layer 13 is provided for the purpose of protecting the reflective layer 12, so that the reflective layer 12 will not be damaged by an etching process at the time of patterning the absorber layer 14 by an etching process, usually by a dry etching process. Accordingly, as the material for the protective layer 13, a material is selected which is hardly susceptible to an influence by the etching process of the absorber layer 14, i.e. a material having an etching rate lower than the absorber layer 14 and yet hardly susceptible to a damage by such an etching process. A material which satisfies such conditions, may, for example, be Cr, Al, Ta or their nitrides, Ru or a Ru compound (such as RuB or RuSi) as well as $SiO_2$, $Si_3N_4$, $Al_2O_3$ or a mixture thereof. Among them, Ru or a Ru compound (such as Ru or RuSi), CrN or $SiO_2$ is preferred, and Ru or a Ru compound (such as Ru or RuSi) is particularly preferred.

The thickness of the protective layer 13 is preferably from 1 to 60 nm, more preferably from 1 to 20 nm.

The protective layer 13 is formed by using a well-known film deposition method such as magnetron sputtering or ion beam sputtering. In a case where a Ru film is formed by magnetron sputtering, it is preferred to carry out film deposition at an applied power of from 30 to 1,500 V at a film deposition rate of from 0.02 to 1 nm/sec so that the thickness will be from 2 to 5 nm by using a Ru target as the target and using an Ar gas (gas pressure: $1\times10^{-2}$ Pa to $10\times10^{-1}$ Pa) as the sputtering gas.

The characteristic particularly required for the absorber layer 14 is a very low EUV light reflectance. Specifically, when the surface of the absorber layer 14 is irradiated with light in a wavelength region of EUV light, the maximum light reflectance in the vicinity of a wavelength of 13.5 nm is preferably at most 5%, particularly preferably at most 3%, further preferably at most 1%.

In the EUV mask blank 1 of the present invention, when the surface of the low reflective layer 15 is irradiated with light in a wavelength region of EUV light, the maximum light reflectance in the vicinity of a wavelength of 13.5 nm is preferably at most 5%, particularly preferably at most 3%, further preferably at most 1%.

In order to attain the above characteristics, the absorber layer 14 is made of a material having a high absorption coefficient of EUV light. As a material having a high absorption coefficient of EUV light, a material containing tantalum (Ta) as the main component is preferably used. In this specification, "a material containing tantalum (Ta) as the main component" means a material containing Ta in an amount of at least 40 at % (atomic %, the same applies hereinafter), preferably at least 50 at %, more preferably at least 55 at % in the material.

The material containing Ta as the main component to be used for the absorber layer 14 may contain, in addition to Ta, at least one element selected from hafnium (Hf), silicon (Si), zirconium (Zr), germanium (Ge), boron (B) and nitrogen (N). Specifically, the material containing the above element in addition to Ta may, for example, be TaN, TaHf, TaHfN, TaBSi, TaBSiN, TaB, TaBN, TaSi, TaSiN, TaGe, TaGeN, TaZr or TaZrN.

However, the absorber layer 14 preferably has a low oxygen (O) content. Specifically, the O content in the absorber layer 14 is preferably less than 25 at %. At the time of patterning the absorber layer 14, usually a dry etching process is employed, and as the etching gas, a chlorine type gas or a fluorine type gas is commonly used. In a case where a film containing Ru or a Ru compound is formed as a protective layer on the reflective layer for the purpose of preventing the reflective layer from being damaged by the etching process, a chlorine type gas is mainly used as the etching gas in view of small damage on the protective layer. However, in the case of carrying out the drying etching process using a chlorine type gas, if the absorber layer 14 contains oxygen, the etching rate will be decreased, and the resist damage will be increased, such being unfavorable. The content of oxygen in the absorber layer 14 is preferably at most 15 at %, more preferably at most 10 at %, further preferably at most 5 at %. Further, it is more preferred that the oxygen contents of the low reflective layer and the absorber layer described hereinafter are both at most 10 at %, particularly preferably at most 5 at %.

It is preferred to set the thickness of the absorber layer 14 so that the total thickness of the absorber layer 14 and the low reflective layer 15 is from 40 to 200 nm, more preferably from 50 to 200 nm, further preferably from 50 to 150 nm, particularly preferably from 50 to 100 nm.

The absorber layer 14 having the above construction can be formed by a known film deposition method, for example, a magnetron sputtering method or an ion bean sputtering method.

For example, in a case where a TaHf film as the absorber layer 14 is formed by employing a magnetron sputtering method, it may be formed under the following conditions.

Sputtering target: TaHf compound target (Ta=30 to 70 at %, Hf=70 to 30 at %)

Sputtering gas: Inert gas such as Ar gas (gas pressure: $1\times10^{-1}$ Pa to $50\times10^{-1}$ Pa, preferably $1\times10^{-1}$ Pa to $40\times10^{-1}$ Pa, more preferably $1\times10^{-1}$ Pa to $30\times10^{-1}$ Pa)

Degree of vacuum before film deposition: at most $1\times10^{-4}$ Pa, preferably at most $1\times10^{-5}$ Pa, more preferably at most $10^{-6}$ Pa Applied power: 30 to 1,000 W, preferably 50 to 750 W, more preferably 80 to 500 W Film deposition rate: 2 to 60 nm/min, preferably 3.5 to 45 nm/min, more preferably 5 to 30 nm/min Further, in a case where a TaN layer as the absorber layer 14 is formed by employing a magnetron sputtering method, it may be formed under the following conditions.

Sputtering target: Ta target

Sputtering gas: $N_2$ gas diluted with an inert gas such as Ar gas (gas pressure: $1\times10^{-1}$ Pa to $50\times10^{-1}$ Pa, preferably $1\times10^{-1}$ Pa to $40\times10^{-1}$ Pa, more preferably $1\times10^{-1}$ Pa to $30\times10^{-1}$ Pa)

Degree of vacuum before film deposition: at most $1\times10^{-4}$ Pa, preferably at most $1\times10^{-5}$ Pa, more preferably at most $10^{-6}$ Pa Applied power: 30 to 1,000 W, preferably 50 to 750 W, more preferably 80 to 500 W Film deposition rate: 2 to 60 nm/min, preferably 3.5 to 45 nm/min, more preferably 5 to 30 nm/min The low reflective layer is constituted by a film which shows low reflection properties to the wavelength of an inspection light to be used for inspection of a mask pattern. In the preparation of an EUV mask, after forming patterning the absorber layer, inspection is carried out to ascertain whether the pattern is formed as designed. In such an inspection of a mask pattern, an inspection machine is used wherein light of about 257 nm is used as an inspection light at present. However, as the pattern width becomes smaller, the wavelength used for the inspection light becomes shorter, and use of light at a wavelength of from 190 to 199 nm is predicted in future. That is, inspection is carried out by the difference in the reflectance to an inspection light having such a wavelength (specifically, the difference in the reflectance between a surface where the absorber layer 14 is removed and exposed by patterning, and the surface of the absorber layer 14 which was not removed by patterning and remains) that is, the contrast of reflected light on such surfaces. Here, the former is the surface of the reflective layer 12. However, in a case where the protective layer 13 is formed on the reflective layer 12, it is the surface of the protective layer 13. Accordingly, if the difference in the reflectance to the wavelength of an inspection light between the surface of the reflective layer 12 or the surface of the protective layer 13 and the surface of the absorber layer 14, the contrast at the time of inspection will be poor, and no accurate inspection can be carried out.

The absorber layer 14 having the above constitution has a very low EUV light reflectance and has excellent characteristics as an absorber layer of the EUV mask blank 1, but in terms of the wavelength of an inspection light, it does not necessarily has a sufficiently low light reflectance. As a result, the difference between the reflectance of the surface of the absorber layer 14 and the reflectance of the surface of the protective layer 13 (or the reflective layer 12) to the wavelength of an inspection light tends to be small, and no sufficient contrast at the time of inspection may be obtained. If no sufficient contrast at the time of inspection is obtained, pattern defects can not sufficiently be detected in the inspection of a mask pattern, and no accurate defect inspection can be carried out.

In the EUV mask blank 1 of the present invention, a low reflective layer 15 to an inspection light for a mask pattern is formed on the absorber layer 14, whereby the contrast at the time of inspection will be good. In the case of the EUV mask blank 1 of the present invention, the contrast of reflected light is a difference in the reflectance between the surface of the reflective layer 12 and the surface of the low reflective layer 15 to the wavelength of an inspection light. However, in a case where the protective layer 13 is formed on the reflective layer 12, it is the difference in the reflectance between the surface of the protective layer 13 and the surface of the low reflective layer 15.

In the EUV mask blank 1 of the present invention, by forming the low reflective layer 15 on the absorber layer 14, the light reflectance is very low in the entire wavelength region (190 to 260 nm) of an inspection light for a mask pattern. Specifically, when the surface of the low reflective layer 15 is irradiated with light in a wavelength region (190 to 260 nm) of an inspection light for a mask pattern, the light reflectance of the surface of the low reflective layer 15 is preferably at most 15%, more preferably at most 10%, further preferably at most 8%, in the entire wavelength region (190 to 260 nm) of an inspection light.

When the maximum light reflectance of the surface of the low reflective layer 15 is at most 15% in the entire wavelength region (190 to 260 nm) of an inspection light for a mask pattern, the contrast at the time of inspection is good regardless of the wavelength of an inspection light for a mask pattern. Specifically, the contrast between reflected light on the surface of the reflective layer 12 (in a case where the protective layer 13 is formed on the reflective layer 12, reflected light on the surface of the protective layer 13) and reflected light on the surface of the low reflective layer 15, is at least 60% in the entire wavelength region (190 to 260 nm) of an inspection light for a mask pattern.

In this specification, the contrast is obtained by the following formula:

$$\text{contrast }(\%)=((R_2-R_1)/(R_2+R_1))\times 100$$

Figure 2:
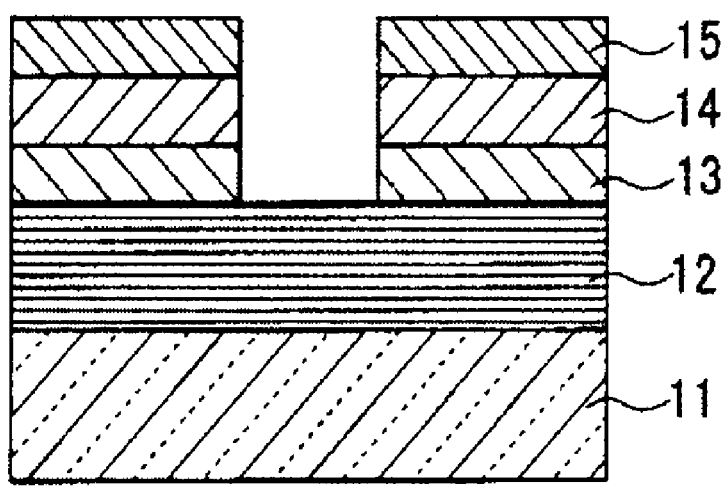
FIG. 2 illustrates a state where an absorber layer 14 and a low reflective layer 15 of an EUV mask blank 1 shown in FIG. 1 are patterned.

In the formula, $R_2$ is the reflectance of the surface of the reflective layer 12 to the wavelength of an inspection light. In a case where the protective layer 13 is formed on the reflective layer 12, it is the reflectance of the surface of the protective layer. $R_1$ is the reflectance of the surface of the low reflective layer 15 to the wavelength of an inspection light. The above $R_1$ and $R_2$ are measured in a state where the absorber layer 14 and the low reflective layer 15 of the EUV mask blank 1 shown in FIG. 1 are patterned, as shown in FIG. 2. The above $R_2$ is a value measured on the surface of the reflective layer 12 or the surface of the protective layer 13 exposed to the outside after the absorber layer 14 and the low reflective layer 15 are removed by patterning, as shown in FIG. 2, and $R_1$ is a value measured on the surface of the low reflective layer 15 which is not removed by patterning and remains.

In the present invention, the contrast represented by the above formula is more preferably at least 65%, further preferably at least 70%.

To achieve the above characteristics, it is preferred that the low reflective layer 15 is constituted by a material having a refractive index in the wavelength region of an inspection light for a mask pattern higher than that of the absorber layer 14 and that its crystalline state is amorphous. In addition, the low reflective layer 15 preferably has a sufficient etching rate in an etching process employing a chlorine type gas.

The low reflective layer 15 of the EUV mask blank 1 of the present invention achieves the above characteristics by containing silicon (Si) and nitrogen (N) in a total content of at least 95 at %.

The low reflective layer 15 preferably contains such elements in the following specific proportion.

The low reflective layer 15 preferably has a Si content of from 5 to 80 at %, and preferably has a N content of from 15 to 90 at % (the low reflective layer 15 having such a composition will sometimes be referred to as a "SiN film". If the Si content is less than 5 at %, the electrical conductivity of the low reflective layer 15 tends to be low, thus leading to a problem of charge up at the time of electron beam patterning on the low reflective layer 15. If the Si content exceeds 80 at %, the light reflectance in the wavelength region of an inspection light for a mask pattern may not sufficiently be low. Further, if the N content is lower than 15 at %, the light reflectance in the wavelength region of an inspection light for a mask pattern may not sufficiently be low. If the N content is higher than 90 at %, the acid resistance of the low reflective layer 15 will be decreased, and the insulating property of the low reflective layer 15 will be increased, thus leading to a problem such as charge up at the time of electron beam patterning on the low reflective layer 15.

The Si content is more preferably from 10 to 80 at %, further preferably from 20 to 80 at %, particularly preferably from 30 to 70 at %. Further, the N content is more preferably from 15 to 85 at %, further preferably from 15 to 75 at %, particularly preferably from 25 to 65 at %.

Further, the low reflective layer 15 may contain an element other than Si and N as the case requires. In such a case, the content to be contained in the low reflective layer 15 is required to satisfy properties as a mask blank such as low reflection properties in the wavelength region of an inspection light for a mask pattern.

As an example of an element to be contained in the low reflective layer 15, at least one member selected from the group consisting of germanium (Ge) and boron (B) may be mentioned. By Ge or B being contained, it is possible to further reduce the crystal particle size, and there is an effect of improving the smoothness on the surface of the low reflective layer 15. The total addition amount of Ge and B is preferably from 0.5 to 16 at %, particularly preferably from 1 to 14 at %.

In a case where the low reflective layer 15 contains Ge or B, it is preferred that the total content of Si, N, Ge and B is at least 95 at %, that the total content of Si, Ge and B is from 5 to 80 at %, and that the compositional ratio of Si to Ge and B is such that Si: (Ge+B)=4:1 to 9:1. If the total content of Si, N, Ge and B is less than 95 at %, the electrical conductivity of the low reflective layer 15 will be decreased, thus leading to a problem of charge up at the time of electron beam patterning on the low reflective layer 15. If the total content of Si, Ge and B exceeds 80 at %, the light reflectance in the wavelength region of an inspection light for a mask pattern may not sufficiently be low. Here, (Ge+B) does not necessarily mean that both Ge and B are contained, and includes a case where only one of them is contained.

In a case where the low reflective layer 15 contains Ge and/or B, the N content in the low reflective layer 15 is preferably from 15 to 90 at %. If the N content is lower than 15 at %, the light reflectance in the wavelength region of an inspection light for a mask pattern may not sufficiently be low. If the N content is higher than 90 at %, the acid resistance of the low reflective layer 15 will be decreased, and insulting property of the low reflective layer 15 will be increased, thus leading to a problem such as charge up at the time of electron beam patterning on the low reflective layer 15.

From the above reasons, the total content of Si, Ge and B is more preferably from 7 to 80 at %, further preferably from 10 to 80 at %. Further, the compositional ratio of Si to Ge and B is more preferably from 4:1 to 8:1, further preferably from 4:1 to 7:1. Further, the N content is more preferably from 15 to 88 at %, further preferably from 15 to 85 at %.

In the EUV mask blank of the present invention, since the low reflective layer has a composition containing Si and N in a total content of at least 95 at %, preferably at least 98 at %, not a composition containing oxygen such as an oxide or an oxynitride as in a conventional mask blank, the light reflectance in the wavelength region of an inspection light for a mask pattern can be made sufficiently low, and a favorable contrast can be obtained at the time of inspection. Further, by Ge or B being contained, the light reflectance in the wavelength region of an inspection light for a mask pattern can be made sufficiently low, and a favorable contrast can be obtained at the time of inspection.

Further, the low reflective layer has a sufficient etching rate in the etching process employing a chlorine type gas, since it satisfies characteristics required for a low reflective layer with a composition containing no oxygen.

Here, as the index to the sufficient etching rate of the low reflective layer in the etching process employing a chlorine type gas, the etching selectivity with the reflective layer (however, usually the protective layer which is formed on the reflective layer) may be employed. The etching selectivity with the reflective layer (or the protective layer) is employed as an index to show a sufficient etching rate of the absorber layer in relation to the reflective layer (or the protective layer). By applying it to the low reflective layer, it is possible to judge whether the low reflective layer has a sufficient etching rate. In this specification, the etching selectivity can be calculated from the following formula:

etching selectivity=(the etching rate of the low reflective layer (or the absorber layer))/(the etching rate of the reflective layer (or the protective layer))

In the case of the absorber layer, the etching selectivity obtained by the above formula is considered to be preferably at least 10, more preferably at least 11, further preferably at least 12. Accordingly, when the etching selectivity of the low reflective layer obtained from the above formula is within the above range, the low reflective layer is considered to have a sufficient etching rate in the etching process employing a chlorine type gas.

As is evident from the above description, the low reflective layer 15 preferably contains no oxygen (O). Specifically, the O content in the low reflective layer 15 is preferably less than 5 at %. As described above for the absorber layer 14, in a dry etching process employing a chlorine type gas for the purpose of patterning the absorber layer 14 and the low reflective layer 15 on the absorber layer, if the low reflective layer 15 contains oxygen, the etching rate will be decreased, whereby the resist tends to be significantly damaged, such being unfavorable.

The oxygen content in the low reflective layer 15 is more preferably at most 4 at %, further preferably at most 3 at %, and it is particularly preferred that the low reflective layer contains substantially no oxygen other than inevitable impurities.

In a case where the low reflective layer 15 is a SiN film, it may contain from 0.1 to 5 at % of B from the target used for film deposition.

The crystalline state of the low reflective layer 15 is preferably amorphous, from the above constitution. In this specification, "the crystalline state is amorphous" includes one having a fine crystal structure in addition to one having an amorphous structure and having no crystal structure at all.

It is preferred that the low reflective layer 15 is a film having an amorphous structure or a film having a fine crystal structure, whereby the surface roughness (rms) of the surface of the low reflective layer 15 is at most 0.5 nm. Here, the surface roughness of the surface of the low reflective layer 15 can be measured by using an atomic force microscope. If the surface roughness of the surface of the low reflective layer 15 is large, the edge roughness of the pattern to be formed on the low reflective layer 15 tends to be large, whereby the dimensional precision of the pattern deteriorates. As the pattern becomes fine, the influence of the edge roughness tends to be distinct, and accordingly, the surface of the low reflective layer 15 is required to be smooth.

When the surface roughness (rms) of the surface of the low reflective layer 15 is at most 0.5 nm, the surface of the low reflective layer 15 is sufficiently smooth, and there is no worry for deterioration of the dimensional precision of the pattern due to an influence of the edge roughness. The surface roughness (rms) of the surface of the low reflective layer 15 is more preferably at most 0.4 nm, further preferably at most 0.3 nm.

Further, the crystalline state of the low reflective layer 15 being amorphous i.e. being an amorphous structure or a fine crystal structure, can be confirmed by an X-ray diffraction (XRD) method. When the crystalline state of the low reflective layer 15 is an amorphous structure or fine crystal structure, no sharp peak will be observed among the diffraction peaks obtainable by the XRD measurement.

As described above, the total thickness of the absorber layer 14 and the low reflective layer 15 is preferably from 40 to 200 nm, more preferably from 50 to 200 nm, further preferably from 50 to 150 nm, particularly preferably from 50 to 100 nm. However, if the thickness of the low reflective layer 15 is more than the thickness of the absorber layer 14, the EUV light absorption properties on the absorber layer 14 may be decreased, and accordingly the thickness of the low reflective layer 15 is smaller than the thickness of the absorber layer. Accordingly, the thickness of the low reflective layer 15 is preferably from 3 to 30 nm, more preferably from 5 to 20 nm.

The low reflective layer 15 having the above constitution, if it is a SiN film, can be formed by a sputtering method employing a Si target, such as a magnetron sputtering method or an ion beam sputtering method. The Si target may contain from 0.1 to 10 at % of B.

Further, it is possible to form a low reflective film containing silicon (Si) and boron (N) and further containing at least one member selected from the group consisting of germanium (Ge) and boron (B) by a sputtering method such as a magnetron sputtering method or an ion beam sputtering method employing a Si target having Ge or B incorporated.

The low reflective layer 15 having the above construction is formed by letting a Si target (or a Si target having Ge or B incorporated) discharge in an atmosphere of a nitrogen ($N_2$) gas diluted with an inert gas such as argon (Ar). In view of the etching rate, in order that the low reflective layer 15 to be formed contains no oxygen atom, it is preferably formed in such an environment that the total partial pressure of oxidizing gases (such as $O_2$, CO, $CO_2$, $H_2O$ and NO) in the sputtering gas is at most $1 \times 10^{-4}$ Pa.

In order to form the low reflective layer 15 on the absorber layer 14 by the above method, specifically, it is formed under the following film deposition conditions.

Film Deposition Conditions for Low Reflective Layer 15 (SiN Film)
Target: Si Target
Sputtering gas: mixed gas of Ar and $N_2$ (Ar gas concentration: 3 to 80 vol %, preferably 5 to 70 vol %, more preferably 10 to 60 vol %, $N_2$ gas concentration: 3 to 80 vol %, preferably 5 to 70 vol %, more preferably 10 to 60 vol %; gas pressure: preferably $1 \times 10^{-2}$ Pa to $40 \times 10^{-1}$ Pa, more preferably $1 \times 10^{-1}$ Pa to $30 \times 10^{-1}$ Pa)
Applied power: 30 to 1,000 W, preferably 50 to 750 W, more preferably 80 to 500 W
Film deposition rate: 0.1 to 60 nm/min, preferably 0.5 to 45 nm/min, more preferably 1 to 30 nm/min In a case where an inert gas other than Ar is used, the concentration of the inert gas is within the same concentration range as the above Ar gas concentration.

Film Deposition Conditions for Low Reflective Layer 15 (SiGeN Film)
Target: SiGe Alloy Target
Sputtering gas: mixed gas of Ar and $N_2$ (Ar gas concentration: 3 to 80 vol %, preferably 5 to 70 vol %, more preferably 10 to 60 vol %, $N_2$ gas concentration: 3 to 80 vol %, preferably 5 to 70 vol %, more preferably 10 to 60 vol %; gas pressure: preferably $1 \times 10^{-2}$ Pa to $40 \times 10^{-1}$ Pa, more preferably $1 \times 10^{-1}$ Pa to $30 \times 10^{-1}$ Pa)
Applied power: 30 to 1,000 W, preferably 50 to 750 W, more preferably 80 to 500 W
Film deposition rate: 0.1 to 60 nm/min, preferably 0.5 to 45 nm/min, more preferably 1 to 30 nm/min Film Deposition Conditions for Low Reflective Layer 15 (SiBN Film)
Target: SiB Alloy Target
Sputtering gas: mixed gas of Ar and $N_2$ (Ar gas concentration: 3 to 80 vol %, preferably 5 to 70 vol %, more preferably 10 to 60 vol %, $N_2$ gas concentration: 3 to 80 vol %, preferably 5 to 70 vol %, more preferably 10 to 60 vol %; gas pressure: preferably $1 \times 10^{-2}$ Pa to $40 \times 10^{-1}$ Pa, more preferably $1 \times 10^{-1}$ Pa to $30 \times 10^{-1}$ Pa)
Applied power: 30 to 1,000 W, preferably 50 to 750 W, more preferably 80 to 500 W
Film deposition rate: 0.1 to 60 nm/min, preferably 0.5 to 45 nm/min, more preferably 1 to 30 nm/min Film Deposition Conditions for Low Reflective Layer 15 (SiGeBN Film)
Target: SiGeB Alloy Target
Sputtering gas: mixed gas of Ar and $N_2$ (Ar gas concentration: 3 to 80 vol %, preferably 5 to 70 vol %, more preferably 10 to 60 vol %, $N_2$ gas concentration: 3 to 80 vol %, preferably 5 to 70 vol %, more preferably 10 to 60 vol %; gas pressure: preferably $1 \times 10^{-2}$ Pa to $40 \times 10^{-1}$ Pa, more preferably $1 \times 10^{-1}$ Pa to $30 \times 10^{-1}$ Pa)
Applied power: 30 to 1,000 W, preferably 50 to 750 W, more preferably 80 to 500
Film deposition rate: 0.1 to 60 nm/min, preferably 0.5 to 45 nm/min, more preferably 1 to 30 nm/min In a case where an inert gas other than Ar is used, the concentration of the inert gas is within the same concentration range as the above Ar gas concentration.

The EUV mask blank 1 of the present invention may have a functional film known in the field of EUV mask blanks, in addition to the reflective layer 12, the protective layer 13, the absorber layer 14 and the low reflective layer 15. As a specific example of such a functional film, a high dielectric coating may be mentioned which is applied on the rear side of a substrate in order to accelerate electrostatic chucking of the substrate, as disclosed in e.g. JP-A-2003-501823. Here, the rear side of the substrate means, on the substrate 11 shown in FIG. 1, the surface opposite to the side on which the reflective layer 12 is formed. For the high dielectric coating to be provided on the rear side of the substrate for such a purpose, the electrical conductivity and the thickness of the constituting material are selected so that the sheet resistance will be at most 100 Ω☐. The constituting material for the high dielectric coating may be selected widely from those disclosed in known literatures. For example, a high dielectric coating disclosed in JP-A-2003-501823, specifically, a coating comprising silicon, TiN, molybdenum, chromium or TaSi, may be applied. The thickness of the high dielectric coating may, for example, be from 10 to 1,000 nm.

The high dielectric coating may be formed by a known film deposition method, for example, a sputtering method such as magnetron sputtering or ion beam sputtering, a CVD method, a vacuum deposition method or an electrolytic plating method.

By at least patterning the absorber layer of the mask blank of the present invention, it is possible to prepare an EUV mask. The method of patterning the absorber layer is not particularly limited, and for example, a method may be employed wherein the absorber layer is coated with a resist to form a resist pattern, which is used as a mask to etch the absorber layer. The material of the resist and the resist pattern lithography method may optionally be selected considering the material of the absorber layer, etc. The method of etching the absorber layer is also not particularly limited, and dry etching such as reactive ion etching or wet etching may be employed. After patterning the absorber layer, the resist is removed by a remover to obtain an EUV mask.

The process for producing a semiconductor integrated circuit employing the EUV mask according to the present invention will be described. The present invention is applicable to a process for producing a semiconductor integrated circuit by photolithography employing EUV light as a light source for exposure. Specifically, a substrate such as a silicon wafer coated with a resist is disposed on a stage, and the EUV mask is placed on a reflection type exposure apparatus constituted by combining reflecting mirrors. Then, the EUV mask is irradiated with EUV light from the light source by means of the reflecting mirrors so that the EUV light is reflected on the EUV mask, whereby the substrate coated with the resist is irradiated with the EUV light. By this pattern transfer step, a circuit pattern is transferred on the substrate. The substrate on which the circuit pattern is transferred is subjected to development so that the exposed portion or non-exposed portion is etched, and then the resist is removed. A semiconductor integrated circuit is prepared by repeatedly carrying out such steps.

EXAMPLES

Now, the present invention will be described in further detail with reference to Examples.

Example 1

In this Example, an EUV mask blank 1 as shown in FIG. 1 was prepared.

As a substrate 11 for film deposition, a $SiO_2$—$TiO_2$ type glass substrate (shape: about 6 inch (about 152 mm) square, thickness: about 6.3 mm) was used. This glass substrate had a thermal expansion coefficient of $0.02 \times 10^{-7}/°$ C., a Young's modulus of 67 GPa, a Poisson's ratio of 0.17 and a specific rigidity of $3.07 \times 10^7$ $m^2/s^2$. This glass substrate was polished to form a smooth surface having a surface roughness (rms) of at most 0.15 nm with a flatness of at most 100 nm.

On the rear side of the substrate 11, a highly dielectric coating having a sheet resistance of 100 Ω/□ was applied by forming a Cr film having a thickness of 100 nm by using a magnetron sputtering method.

On a flat-plate-form usual electrostatic chuck, the substrate 11 (shape: 6 inch (152 mm) square, thickness: 6.3 mm) was fixed by means of the formed Cr film, and on the surface of the substrate 11, a Si film and a Mo film were alternately formed by an ion beam sputtering method for 40 cycles to form a Si/Mo multilayer reflective film (reflective layer 12) having a total film thickness of 272 nm ((4.5 nm+2.3 nm)×40).

Further, on the Si/Mo multilayer reflective film (reflective layer 12), a Ru film (film thickness: 2.5 nm) was formed by an ion beam sputtering method to form a protective layer 13.

The film deposition conditions for the Si film, the Mo film and the Ru film were as follows.
Film Deposition Conditions for Si Film
　Target: Si target (boron-doped)
　Sputtering gas: Ar gas (gas pressure: 0.02 Pa)
　Voltage: 700 V
　Film deposition rate: 0.077 nm/sec
　Film thickness: 4.5 nm
Film Deposition Conditions for Mo Film
　Target: Mo target
　Sputtering gas: Ar gas (gas pressure: 0.02 Pa)
　Voltage: 700 V
　Film deposition rate: 0.064 nm/sec
　Film thickness: 2.3 nm
Film Deposition Conditions for Ru Film
　Target: Ru target
　Sputtering gas: Ar gas (gas pressure: 0.02 Pa)
　Voltage: 500 V
　Film deposition rate: 0.023 nm/sec
　Film thickness: 2.5 nm Then, on the protective layer 13, a TaHf film containing Ta and Hf as the absorber layer 14 was formed by using a magnetron sputtering method.

The absorber layer 14 (TaHf film) was formed by the following method. The film composition is measured by using an X-ray photoelectron spectrometer (manufactured by PERKIN ELEMER-PHI, No. 5500). The composition of the absorber layer is Ta:Hf=55:45. The O content in the absorber layer is at most 0.05 at %.
Film Deposition Conditions for Absorber Layer 14 (TaHf Film)
　Target: TaHf compound target (compositional ratio: Ta 55 at %, Hf 45 at %)
　Sputtering gas: Ar gas (gas pressure: 0.3 Pa)
　Applied power: 150 W
　Film deposition rate: 9.7 nm/min
　Film thickness: 70 nm
　Degree of vacuum before film deposition: $4 \times 10^{-6}$ Pa Then, on the absorber layer 14, a low reflective layer 15 (SiN film) containing Si and N was formed by using a magnetron sputtering method to obtain an EUV mask blank 1 comprising the substrate 11 and the reflective layer 12, the protective layer 13, the absorber layer 14 and the low reflective layer 15 formed in this order over the substrate.

The film deposition conditions for the low reflective layer 15 (SiN film) were as follows.
Film Deposition Conditions for Low Reflective Layer 15 (SiN Film)
　Target: Si target
　Sputtering gas: mixed gas of Ar and $N_2$ (Ar: 20 vol %, $N_2$: 80 vol %, gas pressure: 0.3 Pa)
　Applied power: 150 W
　Film deposition rate: 2 nm/min
　Film thickness: 10 nm With respect to the low reflective layer 15 (SiN film) of the EUV mask blank obtained by the above procedure, the following evaluations (1) to (5) were carried out.
(1) Film Composition The composition of the low reflective layer 15 (SiN film) is measured by using an X-ray photoelectron spectrometer) (manufactured by PERKIN ELEMER-PHI, No.: 5500). The compositional ratio (at %) of the low reflective layer is Si:N=34:66. The O content in the low reflective layer is at most 5 at %.
(2) Crystalline State The crystalline state of the low reflective layer 15 (SiN film) was confirmed by an X-ray diffractmeter (manufactured by Rigaku Corporation). Among the obtained diffraction peaks, no sharp peak was observed, and thus it was confirmed that the crystalline state of the low reflective layer 15 (SiN film) was an amorphous structure or a fine crystal structure.

(3) Surface Roughness

The surface roughness of the low reflective layer 15 (SiN film) is measured by the dynamic force mode by using an atomic force microscope (SPI-3800, manufactured by SII). The region for measurement of the surface roughness is 1 μm×1 μm, and SI-DF40 (manufactured by SII) is used as the cantilever.

The surface roughness (rms) of the low reflective layer was 0.45 nm.

(4) Evaluation for Reflective Properties to Pattern Inspection Wavelength (Evaluation of Contrast)

In this Example, at a state where the protective layer 13 (Ru film) was formed, the reflectance of the surface of the protective layer 13 to an inspection light (wavelength: 257 nm, 199 nm, 193 nm) of a mask pattern was measured by a spectrophotometer (HITACHI UV-4100). Further, after the low reflective layer 15 (SiN film) was formed, the reflectance of the surface of the low reflective layer to an inspection light for a mask pattern was measured. As a result, the reflectances of the surface of the protective layer 13 at wavelengths of 257 nm, 199 nm and 193 nm were 56%, 53.6% and 55%, respectively. Further, the reflectances of the surface of the low reflective layer 15 (SiN film) to the respective wavelengths were 12.4%, 2.4% and 2.7%, respectively, and were at most 15%. The contrast was obtained from these results and the above formula, whereupon the contrasts at the respective wavelengths were as follows.

Contrast at a wavelength of 257 nm: 63.7%
Contrast at a wavelength of 199 nm: 91.3%
Contrast at a wavelength of 193 nm: 90.4%

The contrast between the surface of the protective layer 13 and the surface of the low reflective layer 15 was at least 60% in the entire wavelength region of an inspection light for a mask pattern, and a sufficient contrast was obtained. With respect to the obtained EUV mask blank 1, the surface of the low reflective layer 15 (SiN film) is irradiated with EUV light (wavelength: 13.5 nm) to measure the reflectance of EUV light. As a result, the reflectance of EUV light is 0.8%.

(5) Etching Property

The etching property was evaluated by the following method.

On a sample table (4 inch quartz substrate) of an RF plasma etching apparatus, a Si chip (10 mm×30 mm) having a SiN film or a Ru film formed by the above method, was set as a sample. In this state, the SiN film or the Ru film of the Si chip set on the sample table was subjected to plasma RF etching under the following conditions.

Bias RF: 50 W
Etching time: 120 sec
Trigger pressure: 3 Pa
Etching pressure: 1 Pa
Etching gas: $Cl_2$/Ar
Gas flow rate ($Cl_2$/Ar): 20/80 sccm
Distance between electrode and substrate: 55 mm The etching rates of the Ru film and the SiN film formed under the above conditions were obtained to determine the etching selectivity by the following formula thereby to evaluate the etching property of the low reflective layer.

Etching selectivity=(the etching rate of the SiN film)/
(the etching rate of the Ru film)

The etching selectivity of the SiN film was as follows.
Etching rate of SiN: 15.3 (nm/min)
Etching rate of Ru film: 1.48 (nm/min)
Etching selectivity with Ru film: 10.3

The SiN film satisfies an etching selectivity (at least 10) with the Ru film required for the absorber layer, and was confirmed to have a sufficient etching rate in the etching process employing a chlorine type gas.

Example 2

In this Example, the same operation as in Example 1 was carried out except that as the absorber layer 14, a TaN film containing tantalum (Ta) and nitrogen (N) was formed by using a magnetron sputtering method.

The absorber layer 14 (TaN film) was formed by the following method. The film composition was examined in the same manner as in Example 1. The composition of the absorber layer 14 was Ta:N=57:43. The O content in the absorber layer was at most 0.05 at %.

Film Deposition Conditions for Absorber Layer 14 (TaN Film)

Target: Ta target
Sputtering gas: Ar and $N_2$ (Ar: 86 vol %, $N_2$: 14 vol %, gas pressure: 0.3 Pa)
Applied power: 150 W
Film deposition rate: 7.5 nm/min
Film thickness: 70 nm
Degree of vacuum before film deposition: $4\times10^{-6}$ Pa Then, on the absorber layer 14 (TaN film), a low reflective layer 15 (SiN film) was formed in the same manner as in Example 1 to obtain an EUV mask blank 1. With respect to the obtained EUV mask blank 1, the evaluation of reflective properties (evaluation of contrast) was carried out in the same manner as in Example 1.

The reflectances of the surface of the low reflective layer 15 (SiN film) at wavelengths of 257 nm, 199 nm and 193 nm were 12.9%, 3.5% and 6.3%, respectively, and were at most 15%. From these results and the reflectances of the surface of the protective layer 13, the contrast was obtained by the above formula, whereupon the contrasts at the respective wavelengths were as follows.

Contrast at a wavelength of 257 nm: 62.3%
Contrast at a wavelength of 199 nm: 87.6%
Contrast at a wavelength of 193 nm: 79.4%

The contrasts between the surface of the protective layer 13 and the surface of the low reflective layer 15 were at least 60% in the entire wavelength region of an inspection light for a mask pattern, and a sufficient contrast was obtained. With respect to the obtained EUV mask blank 1, the surface of the low reflective layer 15 (SiN film) was irradiated with EUV light (wavelength: 13.5 nm) to measure the reflectance of the EUV light. As a result, the reflectance of the EUV light is 0.9%.

Example 3

In this Example, an EUV mask blank 1 was obtained in the same manner as in Example 2 except that as the low reflective layer 15, a SiGeN film containing silicon (Si), germanium (Ge) and nitrogen (N) was formed by using a magnetron sputtering method. The low reflective layer 15 (SiGeN film) was formed by the following method.

Film Deposition Conditions for Low Reflective Layer 15 (SiGeN Film)

Target: SiGe target
Sputtering gas: mixed gas of Ar and $N_2$ (Ar: 20 vol %, N2: 80 vol %, gas pressure: 0.3 Pa)
Applied power: 150 W
Film deposition rate: 2 nm/min
Film thickness: 10 nm The film composition of the low reflective layer 15 (SiGeN) is examined in the same manner as in Example 1. The composition of the low reflective layer 15 is Si:Ge:N=29:5:66. The O content in the low reflective layer is at most 5 at %.

The crystalline state of the low reflective layer 15 (SiGeN) was examined in the same manner as in Example 1. The crystalline state of the low reflective layer 15 was confirmed to be an amorphous structure or a fine crystal structure.

The surface roughness of the low reflective layer 15 (SiGeN) was examined in the same manner as in Example 1. The surface roughness (rms) of the low reflective layer 15 was 0.2 nm. It was confirmed that the surface roughness of the low reflective layer 15 (SiGeN) was more improved by addition of Ge as compared with the low reflective layer 15 (SiN) in Example 1.

With respect to the obtained EUV mask blank 1, evaluation of reflective properties (evaluation of contrast) was carried out in the same manner as in Example 1. Specifically, the reflectances of the surface of the low reflective layer 15 (SiGeN film) at wavelengths of 257 nm, 199 nm and 193 nm were 10.9%, 10.0% and 11.0%, respectively, and were at most 15%. From these results and the reflectances of the surface of the protective layer 13, the contrast was obtained from the above formula, whereupon the contrasts at the respective wavelengths were as follows.

Contrast at a wavelength of 257 nm: 70.8%
Contrast at a wavelength of 199 nm: 80.3%
Contrast at a wavelength of 193 nm: 78.3%

The contrast between the surface of the protective layer 13 and the surface of the low reflective layer 15 was at least 60% in the entire wavelength region of an inspection light for a mask pattern, and a sufficient contrast was obtained. With respect to the obtained EUV mask blank 1, the surface of the low reflective layer 15 (SiGeN film) was irradiated with EUV light (wavelength: 13.5 nm) to measure the reflectance of the EUV light. As a result, the reflectance of the EUV light was 0.9%.

The etching property of the low reflective layer 15 (SiGeN) is examined in the same manner as in Example 1. The etching selectivity of the SiGeN film is as follows.

Etching rate of SiGeN: 15.0 (nm/min)
Etching rate of Ru film: 1.48 (nm/min)
Etching selectivity with Ru film: 10.1

The SiGeN film satisfies an etching selectivity (at least 10) with the Ru film required for the absorber layer, and is confirmed to have a sufficient etching rate in the etching process employing a chlorine type gas.

Comparative Example 1

Comparative Example 1 was carried out in the same manner as in Example 1 except that the low reflective layer was a film of an oxynitride of a tantalum/hafnium alloy (TaHfON film). That is, the absorber layer 14 was a TaHf film and the low reflective layer 15 was a film of TaHfON. The TaHfON film was formed by using a TaHf target (Ta:Hf=55 at %:45 at %) under the following conditions. The compositional ratio (at %) of the low reflective layer 15 is measured in the same manner as in Example 1. The compositional ratio (at %) of the low reflective layer 15 is Ta:Hf:N:O=35:15:15:35.

The film deposition conditions for the low reflective layer 15 (TaHfON film) were as follows.

Film Deposition Conditions for Low Reflective Layer 15 (TaHfON Film)

Target: TaHf compound target (compositional ratio: Ta 55 at %, Hf: 45 at %)

Sputtering gas: mixed gas of Ar, $N_2$ and $O_2$ (Ar: 45 vol %, $N_2$: 23 vol %, $O_2$: 32 vol %, gas pressure: 0.3 Pa)
Applied power: 150 W
Film deposition rate: 6.8 nm/min
Film thickness: 10 nm With respect to the low reflective layer 15 (TaHfON film) of the EUV mask blank obtained by the above procedure, the evaluation of reflective properties was carried out in the same manner as in Example 1. The reflectances of the surface of the low reflective layer 15 (TaHfON film) at wavelengths of 257 nm, 199 nm and 193 nm were 0.61%, 16.8% and 15.9%, respectively, and the reflectances exceeded 15% at wavelengths of 199 nm and 193 nm. From these results and the above formula, the contrast was obtained, whereupon the contrasts at the respective wavelengths were as follows.

Contrast at a wavelength of 257 nm: 97.8%
Contrast at a wavelength of 199 nm: 52.1%
Contrast at a wavelength of 193 nm: 55.1%

At a wavelength of 257 nm, the contrast between the surface of the protective layer 13 and the surface of the low reflective layer 15 was at least 90% and was excellent, but at wavelengths of 193 and 199 nm, the contrasts were at most 60%, and no sufficient contrast was obtained.

Further, in the same manner as in Example 1, the etching property of the low reflective layer 15 (TaHfON) was evaluated. The etching selectivity of TaHfON was as follows.

Etching rate of TaHfON: 2.5 (nm/min)
Etching rate of Ru film: 1.48 (nm/min)
Etching selectivity with Ru film: 1.6

The TaHfON film does not satisfy an etching selectivity (at least 10) with the Ru film required for the absorber layer, and was confirmed not to have a sufficient etching rate in the etching process employing a chlorine type gas.

Comparative Example 2

Comparative Example 2 was carried out in the same manner as in Example 2 except that the low reflective layer is a film of an oxynitride of tantalum (Ta) (TaON film). That is, the absorber layer 14 was a TaN film and the low reflective layer 15 was a film of TaON. The TaON film was formed by using a Ta target under the following conditions.

The composition of the low reflective layer is measured in the same manner as in Example 1. The compositional ratio (at %) of the low reflective layer was Ta:N:O=50:15:35.

The film deposition conditions for the low reflective layer 15 (TaON film) were as follows.

Film Deposition Conditions for Low Reflective Layer 15 (TaON Film)

Target: Ta target
Sputtering gas: Ar, $N_2$ and $O_2$ (Ar: 50 vol %, $N_2$: 13 vol %, $O_2$: 37 vol %, gas pressure: 0.3 Pa)
Applied power: 150 W
Film deposition rate: 5.1 nm/min
Film thickness: 10 nm With respect to the low reflective layer 15 (TaON film) of the EUV mask blank obtained by the above procedure, the evaluation of reflective properties was carried out in the same manner as in Example 1. The reflectances of the surface of the low reflective layer 15 (TaON film) at wavelengths of 257 nm, 199 nm and 193 nm were 9%, 22% and 23%, respectively, and the reflectances exceeded 15% at wavelengths of 199 nm and 193 nm. From these results and the above formula, the contrast was obtained, whereupon the contrasts at the respective wavelength were as follows.

Contrast at a wavelength of 257 nm: 72.3%
Contrast at a wavelength of 199 nm: 41.8%
Contrast at a wavelength of 193 nm: 41%

At a wavelength of 257 nm, the contrast between the surface of the protective layer 13 and the surface of the low reflective layer 15 was at least 70% and was sufficient, but at wavelengths of 193 nm and 199 nm, the reflection contrasts were at most 50%, and no sufficient contrast was obtained.

Further, the etching properties of the low reflective layer 15 (TaON) were evaluated in the same manner as in Example 1. The etching selectivity of TaON was as follows.

Etching rate of TaON: 3 (nm/min)
Etching rate of Ru film: 1.48 (nm/min)
Etching selectivity with Ru film: 2

The TaON film does not satisfy an etching selectivity (at least 10) with the Ru film required for the absorber layer, and was confirmed not to have a sufficient etching rate in the etching process employing a chlorine type gas.

Comparative Example 3

Comparative Example 3 was carried out in the same manner as in Example 2 except that the low reflective layer is a film of an oxynitride of silicon (Si) (SiON film). That is, the absorber layer 14 was a TaN film, and the low reflective layer 15 was a film of SiON. The SiON film was formed by using a Si target under the following conditions.

The composition of the low reflective layer is measured in the same manner as in Example 1. The compositional ratio (at %) of the low reflective layer is Si:N:O=45:15:40.

The film deposition conditions for the low reflective layer 15 (SiON film) were as follows.

Film Deposition Conditions for Low Reflective Layer 15 (SiON Film)

Target: Si target
Sputtering gas: Ar, $N_2$ and $O_2$ (Ar: 50 vol %, $N_2$: 13 vol %, $O_2$: 37 vol %, gas pressure: 0.3 Pa)
Applied power: 150 W
Film deposition rate: 3 nm/min
Film thickness: 10 nm With respect to the low reflective layer 15 (SiON film) of the EUV mask blank obtained by the above procedure, the reflective properties were evaluated in the same manner as in Example 2. The reflectances of the surface of the low reflective layer 15 (SiON film) at wavelengths of 257 nm, 199 nm and 193 nm were 23.7%, 19.8% and 15.1%, respectively, and the reflectances exceeded 15% at any wavelength.

From these results and the above formula, the contrast was obtained, whereupon the contrasts at the respective wavelengths were as follows.

Contrast at a wavelength of 257 nm: 40.5%
Contrast at a wavelength of 199 nm: 46%
Contrast at a wavelength of 193 nm: 58.3%

The reflection contrast was at most 60% at any wavelength, and no sufficient contrast was obtained.

Further, the etching properties of the low reflective layer 15 (SiON) are evaluated in the same manner as in Example 1. The etching selectivity of SiON is as follows.

Etching rate of SiON: 3.2 (nm/min)
Etching rate of Ru film: 1.48 (nm/min)
Etching selectivity with Ru film: 2.2

The SiON film does not satisfy an etching selectivity (at least 10) with the Ru film required for the absorber layer, and was confirmed not to have a sufficient etching rate in the etching process employing a chlorine type gas.

Industrial Applicability

The EUV mask blank of the present invention is widely useful for EUV lithography for which a fine pattern is required, as a highly convenient mask blank with which an increase of the etching rate and simplification of an etching process and an etching apparatus can be realized, since etching of the low reflective layer and the absorber layer is possible only with a chlorine type gas.

The entire disclosure of Japanese Patent Application No. 2008-160344 filed on Jun. 19, 2008 including specification, claims, drawings and summary is incorporated herein by reference in its entirety.

Meanings of Symbols
1: EUV mask blank
11: Substrate
12: Reflective layer (multilayer reflective film)
13: Protective layer
14: Absorber layer
15: Low reflective layer

What is claimed is:

1. A reflective mask blank for EUV lithography, comprising:
a substrate;
a reflective layer which reflects EUV light;
an absorber layer which absorbs EUV light; and
a low reflective layer which is low-reflective to an inspection light in a wavelength range of 190 nm to 260 nm for a mask pattern,
wherein the reflective layer, the absorber layer and the low reflective layer are formed over the substrate in an order of the reflective layer, the absorber layer and the low reflective layer, and the low reflective layer contains Si and N in a total content of at least 95 at % and has a Si content of from 5 to 80 at %, a N content of from 15 to 90 at %, and an O content is less than 5 at %.

2. A reflective mask blank for EUV lithography, comprising:
a substrate;
a reflective layer which reflects EUV light;
an absorber layer which absorbs EUV light; and
a low reflective layer which is low-reflective to an inspection light in a wavelength range of 190 nm to 260 nm for a mask pattern,
wherein the reflective layer, the absorber layer and the low reflective layer are formed over the substrate in an order of the reflective layer, the absorber layer and the low reflective layer, and the low reflective layer contains Si, N and at least one selected from the group consisting of Ge and B and has a total content of Si, N, Ge and B of at least 95 at %, a total content of Si, Ge and B of from 5 to 80 at %, a compositional ratio of Si to Ge and B of Si:(Ge+B)=4:1 to 9:1, a N content of from 15 to 90 at %, and an O content is less than 5 at %.

3. The reflective mask blank for EUV lithography according to claim 2, wherein the low reflective layer is formed by a sputtering method in an inert gas atmosphere comprising N with a target comprising Si, N and at least one selected from the group consisting of Ge and B.

4. The reflective mask blank for EUV lithography according to claim 2, wherein the O content of the low reflective layer is at most 4 at %.

5. The reflective mask blank for EUV lithography according to claim 1, wherein the low reflective layer has a surface in which a surface roughness is at most 0.5 nm in rms.

6. The reflective mask blank for EUV lithography according to claim 1, wherein the low reflective layer has a surface in which a crystal structure is amorphous.

7. The reflective mask blank for EUV lithography according to claim 1, wherein the low reflective layer has a thickness of from 3 to 30 nm.

8. The reflective mask blank for EUV lithography according to claim 1, wherein the absorber layer contains Ta as the main component.

9. The reflective mask blank for EUV lithography according to claim 1, wherein the absorber layer contains Ta as the main component and contains at least one element selected from Ha, Si, Zr, Ge, B, N and H.

10. The reflective mask blank for EUV lithography according to claim 1, wherein the absorber layer has an O content of less than 25 at %.

11. The reflective mask blank for EUV lithography according to claim 1, wherein the total thickness of the absorber layer and the low reflective layer is from 40 to 200 nm.

12. The reflective mask blank for EUV lithography according to claim 1, further comprising a protective layer formed between the reflective layer and the absorber layer, wherein the protective layer protects the reflective layer at the time of patterning the absorber layer, and a contrast represented by formula, contrast $(\%)=((R_2-R_1)/(R_2+R_1))\times100$, is at least 60% where $R_2$ is the reflectance of the surface of the protective layer to a wavelength range of from 190 nm to 260 nm of an inspection light for a mask pattern, and $R_1$ is the reflectance of the surface of the low reflective layer to a wavelength range of from 190 nm to 260 nm of an inspection light for a mask pattern.

13. The reflective mask blank for EUV lithography according to claim 12, wherein the protective layer is formed by one of Ru, a Ru compound, $SiO_2$ and CrN.

14. The reflective mask blank for EUV lithography according to claim 1, wherein the reflectance of the surface of the low reflective layer to a wavelength range of from 190 nm to 260 nm of an inspection light for a mask pattern is at most 15%.

15. The reflective mask blank for EUV lithography according to claim 1, wherein the low reflective layer is formed by a sputtering method in an inert gas atmosphere comprising N with a Si target.

16. A reflective mask for EUV lithography, comprising:
a reflective mask blank for EUV lithography according to claim 1,
wherein the absorber layer and the low reflective layer are patterned.

17. A process for producing a semiconductor integrated circuit, comprising:
exposing an object to be exposed through a reflective mask for EUV lithography according to claim 16 such that a semiconductor integrated circuit is produced.

18. The reflective mask blank for EUV lithography according to claim 1, wherein the O content of the low reflective layer is at most 4 at %.

19. A process for producing a reflective mask blank for EUV lithography, comprising:
forming over a substrate a reflective layer which reflects EUV light, an absorber layer which absorbs EUV light, and a low reflective layer which is low-reflective to an inspection light in a wavelength range of 190 nm to 260 nm for a mask pattern,
wherein the reflective layer, the absorber layer and the low reflective layer are formed over the substrate in an order of the reflective layer, the absorber layer and the low reflective layer, and the low reflective layer is formed by a sputtering method in an inert gas atmosphere comprising N with a Si target such that an O content in the low reflective layer is suppressed to less than 5 at %.

20. A process for producing a reflective mask blank for EUV lithography, comprising:
forming over a substrate a reflective layer which reflects EUV light, an absorber layer which absorbs EUV light, and a low reflective layer which is low-reflective to an inspection light in a wavelength range of 190 nm to 260 nm for a mask pattern,
wherein the reflective layer, the absorber layer and the low reflective layer are formed over the substrate in an order of the reflective layer, the absorber layer and the low reflective layer, and the low reflective layer is formed by a sputtering method in an inert gas atmosphere comprising N with a target comprising Si, N and at least one selected from the group consisting of Ge and B such that an O content in the low reflective layer is suppressed to less than 5 at %.

* * * * *